(12) United States Patent
Nishihara et al.

(10) Patent No.: US 12,266,693 B2
(45) Date of Patent: Apr. 1, 2025

(54) SiC EPITAXIAL WAFER, AND METHOD OF MANUFACTURING THE SAME

(71) Applicant: SHOWA DENKO K.K., Tokyo (JP)

(72) Inventors: Yoshitaka Nishihara, Chichibu (JP); Keisuke Fukada, Chichibu (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 17/981,138

(22) Filed: Nov. 4, 2022

(65) Prior Publication Data

US 2023/0055999 A1 Feb. 23, 2023

Related U.S. Application Data

(62) Division of application No. 16/781,294, filed on Feb. 4, 2020, now abandoned.

(30) Foreign Application Priority Data

Feb. 6, 2019 (JP) .................................. 2019-020075

(51) Int. Cl.
*H01L 21/02* (2006.01)
*C30B 25/02* (2006.01)
(Continued)

(52) U.S. Cl.
CPC .......... *H01L 29/1608* (2013.01); *C30B 25/02* (2013.01); *C30B 25/20* (2013.01);
(Continued)

(58) Field of Classification Search
CPC ... C30B 25/02–22; C30B 29/06; C30B 29/36; H01L 21/02529; H01L 21/02378; H01L 21/02447; H01L 29/1608
See application file for complete search history.

(56) References Cited

U.S. PATENT DOCUMENTS

| 7,201,799 B1* | 4/2007 | Velidandla .............. C30B 29/36 |
| | | 117/1 |
| 7,367,865 B2 | 5/2008 | Blaum et al. |
| (Continued) | | |

FOREIGN PATENT DOCUMENTS

| JP | 2007-269627 A | 10/2007 |
| JP | 2015-40146 A | 3/2015 |
| (Continued) | | |

OTHER PUBLICATIONS

"Evaluation and Reduction of Epitaxial Wafer Defects Resulting from Carbon-Inclusion Defects in 4H-SiC Substrate" by Ling Guo, Koji Kamei, Kenji Momose and Hiroshi Osawa in Materials Science Forum, vol. 897, pp. 39-42 (Year: 2017).*

(Continued)

*Primary Examiner* — Eric A. Ward
(74) *Attorney, Agent, or Firm* — Sughrue Mion, PLLC

(57) ABSTRACT

A method of manufacturing a SiC epitaxial wafer in which a SiC epitaxial layer is formed on a SiC single crystal substrate, the method including identifying a total number of large-pit defects caused by micropipes in the SiC single crystal substrate and large-pit defects caused by substrate carbon inclusions, both of which are contained in the SiC epitaxial layer, using microscopic and photoluminescence images. Also disclosed is a method of manufacturing a SiC epitaxial wafer in which a SiC epitaxial layer is formed on a single crystal substrate, the method including identifying locations of the large-pit defects caused by micropipes in the SiC single crystal substrate and the large-pit defects caused by substrate carbon inclusions in the SiC epitaxial layer, using microscopic and photoluminescence images.

16 Claims, 2 Drawing Sheets

(51) Int. Cl.
    *C30B 25/20*     (2006.01)
    *C30B 29/36*     (2006.01)
    *H01L 29/16*     (2006.01)
    *H01L 29/36*     (2006.01)

(52) U.S. Cl.
    CPC ........ *C30B 29/36* (2013.01); *H01L 21/02378* (2013.01); *H01L 21/02529* (2013.01); *H01L 29/36* (2013.01)

(56) References Cited

U.S. PATENT DOCUMENTS

| | | | |
|---|---|---|---|
| 10,229,836 | B2 | 3/2019 | Wada et al. |
| 2008/0067524 | A1* | 3/2008 | Basceri ............ H01L 21/02433 257/E29.345 |
| 2012/0280254 | A1 | 11/2012 | Muto et al. |
| 2013/0280466 | A1* | 10/2013 | Zwieback ................ B28D 5/00 428/64.1 |
| 2014/0070234 | A1* | 3/2014 | Loboda ............. H01L 21/02447 257/77 |
| 2014/0145214 | A1 | 5/2014 | Kageshima et al. |

FOREIGN PATENT DOCUMENTS

| | | |
|---|---|---|
| JP | 2015-54814 A | 3/2015 |
| JP | 2018-039714 A | 3/2018 |
| JP | 2018-41942 A | 3/2018 |

OTHER PUBLICATIONS

"Characterization of SiC Wafers by Photoluminescence Mapping" by M. Tajima et al. in Materials Science Forums vol. 527-529 (Year: 2006).*
"Classification of Killer and Non-Killer Silicon Carbide Epitaxial Defects and Accurate Prediction of Device Yield" by H. Das et al. in ECE Transactions, 80 (7) 239-243 (Year: 2017).*
"Origin Analysis and Elimination of Obtuse Triangular Defects in 4° off 4H-SiC Epitaxy" by K.L. Mao et al. in Materials Science Forum vol. 924 pp. 168-171 (Year: 2018).*
"Triangular Defects Reduction and Uniformity Improvement of 4H-SiC Epitaxial Growth in a Planetary Reactor" by Weili Lu et al., Materials Science Forum vol. 924 pp. 104-107 (Year: 2018).*
JEITA standard EDR-2712/100,200 (Year: 2017).*
C. Hallin et al., "The origin of 3 polytype inclusions in epitaxial layers of silicon carbide grown by chemical vapour deposition", Diamond and Related Materials 6 (1997) 1297-1300.
Communication dated May 31, 2022, issued in Japanese Application No. 2019-020075.
J. Hassan et al., "Characterization of the carrot defect in 4H-SiC epitaxial layers", Journal of Crystal Growth 312 (2010) 1828-1837.
Kubota, T., Talekar, P., Ma, X. et al. "A nondestructive automated defect detection system for silicon carbide wafers" Machine Vision and Applications 16, 170-176 (2005) (Year: 2005).

* cited by examiner

FIG. 1
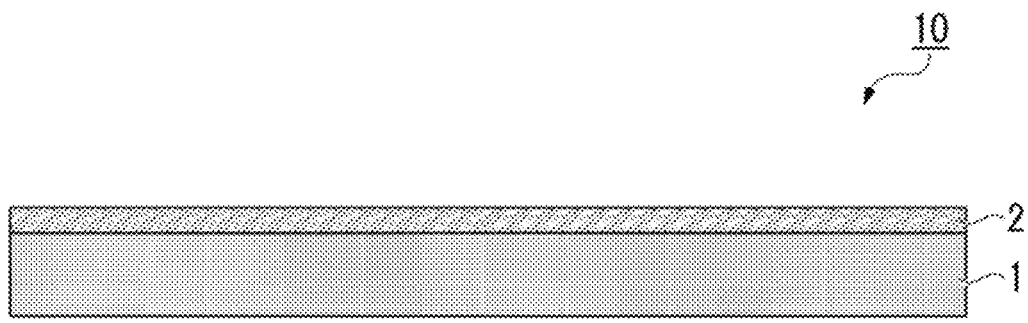
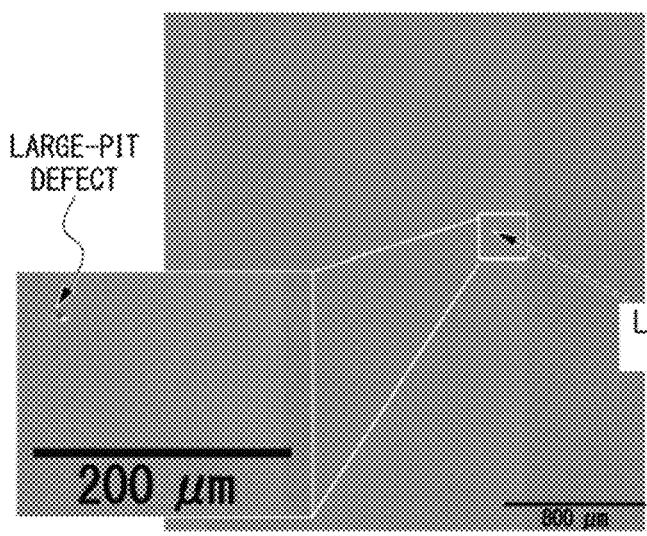
FIG. 2A
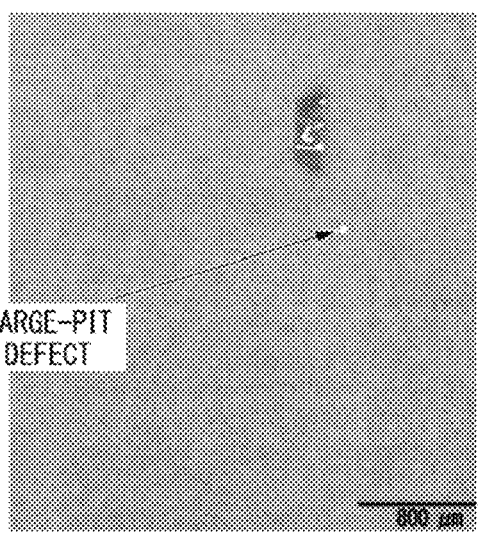
FIG. 2B

SiC EPITAXIAL WAFER, AND METHOD OF MANUFACTURING THE SAME

CROSS-REFERENCE TO RELATED APPLICATIONS

This application is a Rule 53(b) Divisional of U.S. application Ser. No. 16/781,294 filed Feb. 4, 2020, claiming priority based on Japanese Patent Application No. 2019-020075 filed Feb. 6, 2019, the above-noted applications incorporated herein by reference in their respective entireties.

BACKGROUND OF THE INVENTION

Field of the Invention

The present invention relates to a SiC epitaxial wafer and a method of manufacturing the same.

Background Art

Silicon carbide (SiC) has characteristics such as a dielectric breakdown electric field one order of magnitude larger, a band gap three times larger, and a thermal conductivity approximately three times higher than that of silicon (Si). Since silicon carbide has these characteristics, it is expected that the silicon carbide will be applied to power devices, high-frequency devices, high-temperature operating devices, and the like. For this reason, in recent years, SiC epitaxial wafers have been used for the above-described semiconductor devices.

In order to promote the practical application of SiC devices, it is essential to establish a high-quality crystal growth technique and a high-quality epitaxial growth technique.

SiC devices are generally manufactured using a SiC epitaxial wafer obtained by growing a SiC epitaxial layer (film) serving as an activated region of a device on a SiC single crystal substrate (may also be simply referred to as a SiC substrate), obtained by being processed from SiC bulk single crystal grown by sublimation recrystallization method or the like, through chemical vapor deposition (CVD) or the like.

More specifically, SiC epitaxial wafers are generally obtained by performing step flow growth (lateral growth from atomic steps) on a SiC single crystal substrate having a surface with an off-angle in a <11-20> direction from a (0001) plane as a growth surface to grow a 4H—SiC epitaxial layer.

As defects in the epitaxial layer of the SiC epitaxial wafer, defects that inherit defects in the SiC single crystal substrate and defects newly formed in the epitaxial layer are known. Threading dislocations, basal plane dislocations, carrot defects, and the like are known as the former, and triangular defects and the like are known as the latter.

For example, although a carrot defect is a rod-like defect which is long in the step-flow growth direction when viewed from the epitaxial surface side, it is said to be formed by using dislocations of the substrate (threading screw dislocations (TSD) or basal plane dislocations (BPD)) or scratches on the substrate as starting points (see Non-Patent Document 1).

Further, a triangular defect is formed toward a direction in such a manner that the apex of the triangle and the opposite side (base) thereof are aligned in order from the upstream to downstream side along the step-flow growth direction (<11-20> direction). The triangular defect is said to be a defect which is originated from the foreign matter (downfall) present on the SiC single crystal substrate before epitaxial growth at the time of manufacturing the SiC epitaxial wafer or within the epitaxial layer during epitaxial growth as a starting point, and which is exposed on the epitaxial surface by extending a 3 C polymorphous layer along the off angle of the substrate (see Non-Patent Document 2).

Recently, large-pit defects caused by carbon inclusions in a SiC single crystal substrate (hereinafter sometimes referred to as "substrate carbon inclusions") have been found (see Patent Document 1). The large-pit defects caused by substrate carbon inclusions are converted as new defects in the epitaxial layer from the substrate carbon inclusions in the SiC single crystal substrate as a starting point.

CITATION LIST

Patent Documents

[Patent Document 1] Japanese Unexamined Patent Application, First Publication No. 2018-039714

Non-Patent Documents

[Non-Patent Document 1] J. Hassan et al., Journal of Crystal Growth 312 (2010) 1828-1837

[Non-Patent Document 2] C. Hallin et al., Diamond and Related Materials 6 (1997) 1297-1300

SUMMARY OF THE INVENTION

It is known that $V_F$ degradation (bipolar degradation) occurs when current is applied in a forward direction to an element configured to perform a bipolar operation, such as a pn diode or a parasitic diode (body diode) of a MOSFET, which is manufactured using a SiC epitaxial wafer. The $V_F$ deterioration is a phenomenon in which, when current flows in the forward direction, the basal plane dislocation expands to a stacking fault (SF), which is a plane defect, and the stacking fault acts as a resistance, thereby causing an increase in the forward voltage ($V_F$).

As a result of intensive studies, the present inventor has found for the first time that large-pit defects expand to stacking faults due to forward conduction and cause $V_F$ deterioration. It has been known that after a forward current is applied, a stacking fault is formed by expanding from a basal plane dislocation as a starting point. However, it has not been previously known that after a forward current is applied, a stacking fault is formed by expanding from a large-pit defect as a starting point. It is considered that the mechanism of formation of stacking faults originating from the large-pit defects involves dislocations extending in the direction of the basal plane accompanying the large-pit defects.

Both large-pit defects caused by substrate carbon inclusions and large-pit defects caused by micropipes in the substrate can be expanded and converted into stacking faults from the large-pit defects as a starting point after the forward conduction is applied.

Therefore, as a SiC epitaxial wafer for the SiC device, it is required to use a SiC epitaxial wafer having a reduced density of large-pit defects, and it is desirable to use a SiC epitaxial wafer having no large-pit defects.

The present invention has been made in view of the above-described problem, and an object thereof to provide a SiC epitaxial wafer in which $V_F$ deterioration is suppressed and a method of manufacturing the same.

The present invention provides the following means in order to solve the above-described problem.

(1) A SiC epitaxial wafer comprising a SiC epitaxial layer formed on a SiC single crystal substrate, wherein a total density of large-pit defects caused by micropipes in the substrate and large-pit defects caused by substrate carbon inclusions, both of which are contained in the SiC epitaxial layer, is 1 defect/cm² or less.

(2) A SiC epitaxial wafer according to (1), wherein a density of the large-pit defects caused by micropipes in the substrate is 0.5 defect/cm² or less.

(3) A method of manufacturing a SiC epitaxial wafer in which a SiC epitaxial layer is formed on a single crystal substrate, the method comprising
   a step of selecting a SiC single crystal substrate in which a total density of micropipes and substrate carbon inclusions in the SiC single crystal substrate is 1 defect/cm² or less.

The present invention can provide a SiC epitaxial wafer in which $V_F$ deterioration is suppressed.

BRIEF DESCRIPTION OF THE DRAWINGS

FIG. 1 is a schematic cross-sectional view of a SiC substrate wafer according to an embodiment of the present invention.

FIG. 2A is a SICA image of a SiC substrate wafer of the present invention.

FIG. 2B is a PL image corresponding to FIG. 2A.

PREFERRED EMBODIMENTS

Figure 3:
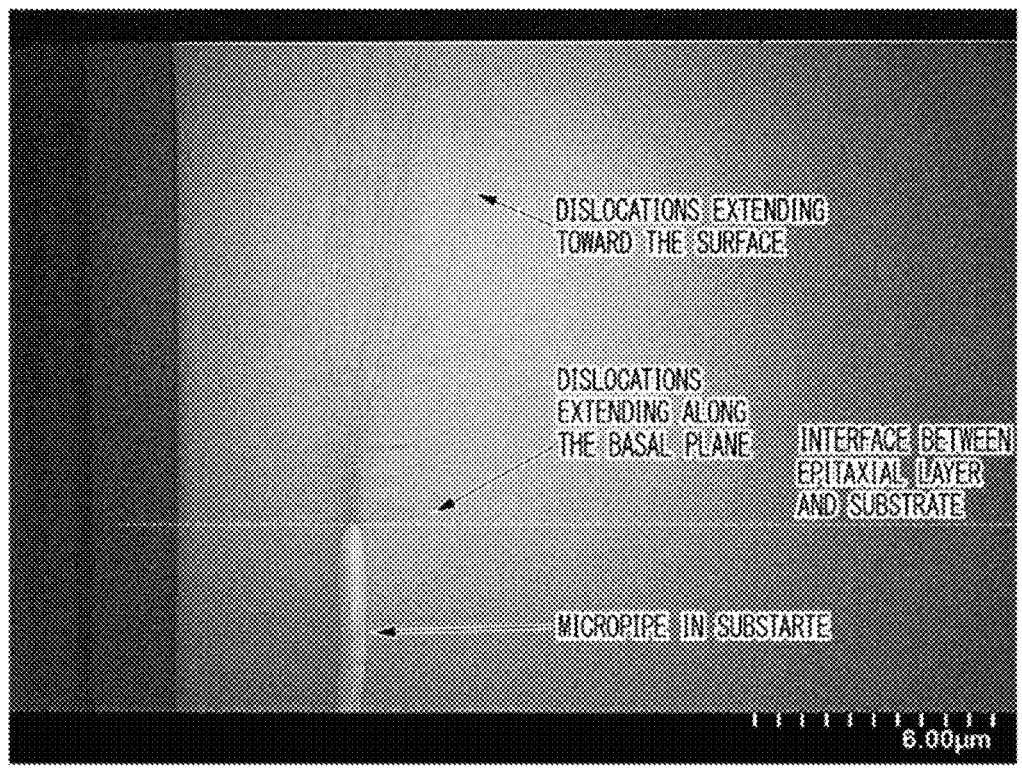
FIG. 3 is a STEM image of a cross section in the vicinity of a large-pit defect caused by micropipes in the substrate.

Hereinafter, a SiC epitaxial wafer and a method of manufacturing the same according to an embodiment to which the present invention is applied will be described in detail with reference to the accompanying drawings. Meanwhile, in the drawings used in the following description, characteristic portions may be illustrated at an enlarged scale for convenience of easy understanding of characteristics, and the dimensional ratios and the like of the respective components are not necessarily the same as the actual ones. Further, in the following description, materials, dimensions, and the like are merely exemplary, do not limit the present invention, and can be appropriately modified within a range in which the effects of the present invention are exerted.

(SiC Epitaxial Wafer)

FIG. 1 illustrates a schematic cross-sectional view of a SiC epitaxial wafer according to an embodiment of the present invention.

A SiC epitaxial wafer 10 shown in FIG. 1 is a SiC epitaxial wafer comprising a SiC epitaxial layer 2 formed on a SiC single crystal substrate 1, wherein a total density of large-pit defects caused by micropipes in the substrate and large-pit defects caused by substrate carbon inclusions, both of which are contained in the SiC epitaxial layer 2, is 1 defects/cm² or less.

The SiC single crystal substrate used in the SiC epitaxial wafer of the present invention is preferably a 4H—SiC single crystal substrate.

The SiC single crystal substrate used in the SiC epitaxial wafer of the present invention preferably has an off angle. For example, it is preferable to use a SiC single crystal substrate having an off angle of 0.4° or more and 8° or less. Typically, a SiC single crystal substrate having an off angle of 4° can be used.

Although the thickness of the SiC single crystal substrate is not particularly limited, for example, a SiC single crystal substrate having a thickness of 150 μm or more and 550 μm or less can be used. Preferably, a SiC single crystal substrate having a thickness of 300 μm or more and 400 μm or less can be used.

Although the size of the SiC single crystal substrate is not particularly limited, for example, a SiC single crystal substrate with a size of 3 inches to 6 inches can be used.

In the present specification, the term "large-pit defect" refers to a defect having the following characteristics when an inspection apparatus (manufactured by Lasertec Corporation, SICA88) having both a confocal differential interference microscope and a photoluminescence (PL) observation function is used. In an obtained microscope image (hereinafter sometimes referred to as "SICA image"), the defect appears a dent or hole having a size (maximum distance when connecting two points on the outer circumference of the image with a straight line) of 5 μm or more. In addition, in a PL image obtained using a long-pass filter (≥660 nm), the defect appears bright with a size equal to or larger than the size in the microscope image.

Regarding smaller ones of defects that are pits or holes with a size of 5 μm or more and less than 10 μm in the SICA image and appear bright in the PL image at the same size or larger than the size in the microscope image, empirically, about 50% of the smaller ones is not due to substrate carbon inclusions or to micropipes in the substrate. In other words, about 50% of such defects are caused by substrate carbon inclusions or micropipes in the substrate.

Regarding defects that are pits or holes with a size of 10 μm or more and less than 15 μm in the SICA image and appear bright in the PL image at the same size or larger than the size in the microscope image, empirically, about 90% of the defects are caused by substrate carbon inclusions or micropipes in the substrate.

Regarding defects that are pits or holes with a size of 15 μm or more in the SICA image and appear bright in the PL image at the same size or larger than the size in the microscope image, empirically, about 100% of the defects are caused by substrate carbon inclusions or micropipes in the substrate.

As described above, based on the size of the dent or hole of the SICA image of the SiC epitaxial wafer and the size and appearance of the PL image of the dent or hole, the probability that the dent or hole is one of the large-pit defect caused by the substrate carbon inclusion and the large-pit defect caused by the micropipe in the substrate can be identified by the above probability.

By combining the SICA image and the PL image of the SiC epitaxial wafer with the SICA image and the PL image of the SiC single crystal substrate, large-pit defects caused by substrate carbon inclusions and large-pit defects caused by micropipes in the substrate can be distinguished with high probability. In the following, a method for performing the above will be described.

<A Method for Distinguishing Large-Pit Defects Caused by Micropipes in the Substrate and Large-Pit Defects Caused by Substrate Carbon Inclusions>

The cause of the large-pit defect in the SiC epitaxial layer of the SiC epitaxial wafer can be identified with high accuracy by comparing the SICA image and the PL image of the substrate carbon inclusions and micropipes in the SiC single crystal substrate with the SICA image and the PL image of the SiC epitaxial wafer.

In a case that a dark spot exists in the PL image of the SiC single crystal substrate, when a dark spot exists at almost the same position in a PL image of an adjacent SiC single crystal substrate in the same ingot as the SiC single crystal substrate, the dark spot can be identified as a micropipe in the substrate. As a result, a large-pit defect formed at a position corresponding to the dark spot on the SiC epitaxial wafer after forming an epitaxial layer can be identified as a large-pit defect caused by a micropipe in the substrate. The large-pit defect at this time is observed as a pit in the SICA image, and is often observed as a bright circle (including oval shape, oblate shape, and so on) or a spider web (a core at the center and a string around it, a collection of strings, and so on) in the PL image.

In a case that a pit exists in the SICA image of the SiC single crystal substrate and a dark spot exists in the PL image of the SiC single crystal substrate, when a dark spot does not exist at almost the same position in a PL image of an adjacent SiC single crystal substrate in the same ingot as the SiC single crystal substrate, the dark spot can be identified as a substrate carbon inclusion. As a result, a large-pit defect formed at a position corresponding to the dark spot on the SiC epitaxial wafer after forming an epitaxial layer can be identified as a large-pit defect caused by a substrate carbon inclusion. The large-pit defect at this time is observed as a pit in the SICA image, and is often observed as a bright circle (including oval shape, oblate shape, and so on) in the PL image.

Note that the observation of the cross section of the SiC epitaxial wafer with an electron microscope or the like also makes it possible to accurately distinguish large-pit defects caused by micropipes in the substrate from large-pit defects caused by substrate carbon inclusions.

In a SiC epitaxial wafer, if the total density of large-pit defects caused by micropipes in the substrate and large-pit defects caused by substrate carbon inclusions is 1 defect/cm$^2$ or less, the SiC epitaxial wafer satisfies the specifications of a normal SiC device.

Here, the "large-pit defects caused by micropipes in the substrate and large-pit defects caused by substrate carbon inclusions" in "the total density of large-pit defects caused by micropipes in the substrate and large-pit defects caused by substrate carbon inclusions" in SiC epitaxial wafers corresponds to defects having the following characteristics for each size. Regarding defects that are pits or holes with a size of 5 µm or more and less than 10 µm in the SICA image and appear bright in the PL image at the same size or larger than the size in the SICA image, it is assumed that 50% of the counted number of defects corresponds to the above-described defects. Regarding defects that are pits or holes with a size of 10 µm or more and less than 15 µm in the SICA image and appear bright in the PL image at the same size or larger than the size in the SICA image, it is assumed that 90% of the counted number of defects corresponds to the above-described defects. Regarding defects that are pits or holes with a size of 15 µm or more in the SICA image and appear bright in the PL image at the same size or larger than the size in the SICA image, it is assumed that all of the counted number of defects corresponds to the above-described defects. The sum of these defects is defined as the total number of the above-described defects. "The total density of large-pit defects caused by micropipes in the substrate and large-pit defects caused by substrate carbon inclusions" means an area density obtained by dividing the total number of the above defects by the unit area.

In a SiC epitaxial wafer, the total density of large-pit defects caused by micropipes in the substrate and large-pit defects caused by substrate carbon inclusions is preferably 0.1 defect/cm$^2$ or less, it is more preferably 0.01 defect/cm$^2$ or less, and it is even more preferably 0 defect/cm$^2$ or less.

FIGS. 2A and 2B are a SICA image and a PL image of a SiC substrate wafer of the present invention. FIG. 2A is a SICA image and FIG. 2B is a PL image.

The SiC epitaxial wafer was manufactured as follows.

A 4-inch 4H—SiC single crystal substrate having an off angle of 4° in the <11-20> direction with respect to the (0001) Si plane was used as a SiC single crystal substrate.

A known polishing step was performed on the 4H—SiC single crystal substrate. Thereafter, the single crystal substrate was set in a CVD apparatus, and a step of cleaning (etching) the single crystal substrate surface with hydrogen gas was performed. Next, a SiC epitaxial growth step was performed under the conditions of a growth temperature of 1500° C. or more and a C/Si ratio of 1.25 or less while using silane and propane as source gases and supplying hydrogen as a carrier gas. Thus, a 10 µm-thick SiC epitaxial layer was formed on the SiC single crystal substrate to obtain a SiC epitaxial wafer.

The large-pit defect in the SiC epitaxial wafer shown in FIG. 2 has a circular shape with a diameter of about 15 µm in the SICA image and a circular shape with a diameter of about 20 to 30 µm in the PL image. An SICA image was obtained on the surface of the 4H—SiC single crystal substrate before the formation of the SiC epitaxial layer. It was confirmed by a cross-sectional analysis that this large-pit defect was a large-pit defect caused by a micropipe in the substrate.

FIG. 3 is an image obtained by observing the cross section of the large-pit defect using a scanning transmission electron microscope (STEM). The scale indicates 0.6 µm on each scale.

The STEM image shown in FIG. 3 is an example. In the STEM image, a micropipe is visible in the substrate located below. Further, dislocations extending from the micropipe in the substrate are present, and large-pit defects (FIG. 2) are visible on the surface located at the tip of the dislocation. Thus, the STEM image shown in FIG. 3 clearly shows that the large-pit defect on the surface of the epitaxial layer is a large-pit defect caused by the micropipe in the substrate. Dislocations are present between the micropipe in the substrate and the large-pit defects on the surface, as shown in FIG. 3. Some of these dislocations extend along the basal plane in addition to those extending toward the surface. The dislocations extending along the basal plane expand into stacking faults when forward current is applied, causing $V_F$ degradation.

Figure 4:
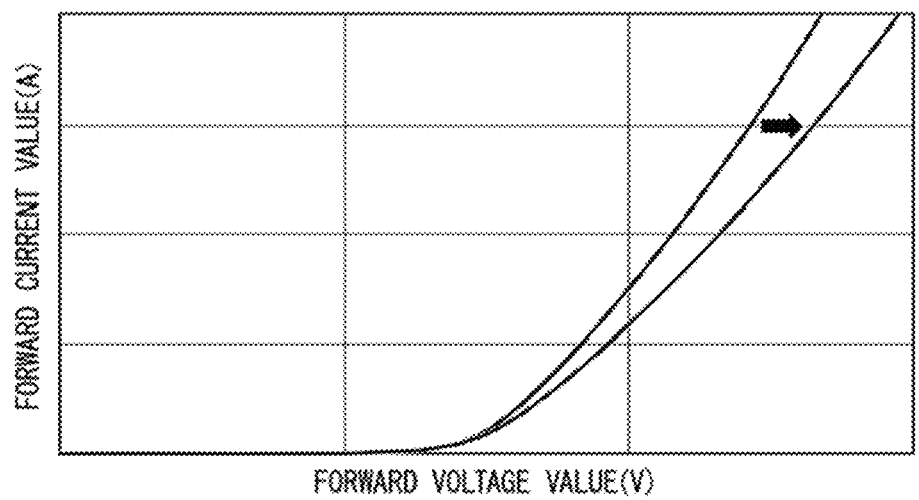
FIG. 4 is a graph showing electrical characteristics of a pn diode manufactured using the SiC epitaxial wafer shown in FIG. 2 before and after a forward conduction test.

A pn diode was produced by a known method using the SiC epitaxial wafer shown in FIG. 2. FIG. 4 shows the results of measuring the electrical characteristics in the forward direction before and after the current was passed through the pn diode at 960 A/cm$^2$ for 1 hour. It was confirmed that this current test resulted in a 3.4% forward voltage ($V_F$) deterioration. At this time, a SiC epitaxial wafer having no BPD in the SiC epitaxial layer and a BPD density of the SiC single crystal substrate of 400/cm$^2$ or less was used. Thus, the contribution of deterioration due to a defect expansion factor other than the large-pit defect was reduced.

A density of the large-pit defects caused by micropipes in the substrate in SiC epitaxial wafer of the present invention is preferably 0.5 defect/cm$^2$ or less.

Here, "a density of the large-pit defects caused by micropipes in the substrate" in SiC epitaxial wafer means an area density obtained by dividing the counted number of large-pit defects identified as large pit defects caused by micropipes in the substrate by the unit area. Identification of the large-pit defects caused by micropipes in the substrate was described above. That is, the large-pit defect caused by micropipe in the substrate is observed as a pit in the SICA image of SiC epitaxial wafer using an adjacent SiC single crystal substrate in the same ingot, and is often observed as a bright circle (including oval shape, oblate shape, and so on) or a spider web (a core at the center and a string around it, a collection of strings, and so on) in the PL image.

The inventor has found that the micropipe of the substrate, especially located at the peripheral edge portion of the substrate, is liable to crack during the growth of the SiC epitaxial layer.

It is feared that even those which did not crack during the growth of the SiC epitaxial layer were liable to crack in subsequent device fabrication. However, if the density of large-pit defects caused by micropipes in the substrate is 10 defects/cm$^2$ or less, the fear is eliminated.

(Method of Manufacturing a SiC Epitaxial Wafer)

A method of manufacturing a SiC epitaxial wafer according to an embodiment of the present invention is a method of manufacturing a SiC epitaxial wafer in which a SiC epitaxial layer is formed on a single crystal substrate, which includes a step of selecting a SiC single crystal substrate in which a total density of micropipes and substrate carbon inclusions in the SiC single crystal substrate is 1 defect/cm$^2$ or less.

Here, "a total density of micropipes and substrate carbon inclusions in the SiC single crystal substrate" in the method of manufacturing a SiC epitaxial wafer means an area density obtained by dividing the total counted number of micropipes and substrate carbon inclusions in the SiC single crystal substrate by the unit area. The micropipe and the substrate carbon inclusion in the SiC single crystal substrate are observed as a pit in the SICA image of the SiC single crystal substrate and as a dark spot in the PL image of the SiC single crystal substrate.

Other steps such as a step of polishing the substrate and a step of forming a SiC epitaxial layer can be performed under known conditions.

According to the method of manufacturing a SiC epitaxial wafer having a selecting step, a SiC epitaxial wafer, in which a total density of large-pit defects caused by micropipes in the substrate and large-pit defects caused by substrate carbon inclusions, both of which are contained in the SiC epitaxial layer, is 1 defect/cm$^2$ or less, can be manufactured.

What is claimed is:

1. A method of manufacturing a SiC epitaxial wafer in which a SiC epitaxial layer is formed on a SiC single crystal substrate, comprising:
    a step of forming a SiC epitaxial layer on a SiC single crystal substrate,
    a step of obtaining microscopic and photoluminescence images of the SiC epitaxial wafer using an inspection apparatus,
    a step of identifying large-pit defects caused by micropipes in the SiC single crystal substrate and large-pit defects caused by substrate carbon inclusions, both of which are contained in the SiC epitaxial layer, using the microscopic and photoluminescence images,
    a step of distinguishing the large-pit defects caused by micropipes in the substrate and the large-pit defects caused by substrate carbon inclusions by comparing the microscopic and photoluminescence images of the SiC epitaxial wafer with microscopic and the photoluminescence images of a SiC single crystal substrate in the same ingot as the SiC single crystal substrate,
    a step of identifying a total number of the large-pit defects caused by micropipes in the SiC single crystal substrate and the large-pit defects caused by substrate carbon inclusions based on the distinguishing step,
    wherein a total density of the large-pit defects caused by micropipes in the SiC single crystal substrate and the large-pit defects caused by substrate carbon inclusions is 1 defect/cm$^2$ or less.

2. The method of manufacturing a SiC epitaxial wafer according to claim 1, further comprising: a step of identifying locations of the large-pit defects caused by micropipes in the SiC single crystal substrate in the SiC epitaxial layer, using the microscopic and photoluminescence images.

3. The method of manufacturing a SiC epitaxial wafer according to claim 1, further comprising: a step of identifying locations of the large-pit defects caused by micropipes in the SiC single crystal substrate and the large-pit defects caused by substrate carbon inclusions in the SiC epitaxial layer, using the microscopic and photoluminescence images.

4. The method of manufacturing a SiC epitaxial wafer according to claim 1, wherein a density of the large-pit defects caused by micropipes in the SiC single crystal substrate is 10 defect/cm$^2$ or less.

5. The method of manufacturing a SiC epitaxial wafer according to claim 1, wherein a density of the large-pit defects caused by micropipes in the SiC single crystal substrate is 0.5 defect/cm$^2$ or less.

6. The method of manufacturing a SiC epitaxial wafer according to claim 1, wherein a total density of the large-pit defects caused by micropipes in the SiC single crystal substrate and the large-pit defects caused by substrate carbon inclusions is 0.1 defect/cm$^2$ or less.

7. The method of manufacturing a SiC epitaxial wafer according to claim 1, wherein a total density of the large-pit defects caused by micropipes in the SiC single crystal substrate and the large-pit defects caused by substrate carbon inclusions is 0.01 defect/cm$^2$ or less.

8. The method of manufacturing a SiC epitaxial wafer according to claim 1, wherein a total density of the large-pit defects caused by micropipes in the SiC single crystal substrate and the large-pit defects caused by substrate carbon inclusions is 0 defect/cm$^2$.

9. The method of manufacturing a SiC epitaxial wafer according to claim 1, further comprising: a step of selecting the SiC epitaxial wafer in which a total density of the large-pit defects caused by micropipes and the large-pit defects caused by substrate carbon inclusions is 1 defect/cm$^2$ or less.

10. The method of manufacturing a SiC epitaxial wafer according to claim 1, further comprising: a step of selecting the SiC epitaxial wafer in which a total density of the large-pit defects caused by micropipes and the large-pit defects caused by substrate carbon inclusions is 0.1 defect/cm$^2$ or less.

11. The method of manufacturing a SiC epitaxial wafer according to claim 1, further comprising: a step of selecting the SiC epitaxial wafer in which a total density of the large-pit defects caused by micropipes and the large-pit defects caused by substrate carbon inclusions is 0.01 defect/cm$^2$ or less.

12. The method of manufacturing a SiC epitaxial wafer according to claim 1, further comprising: a step of selecting the SiC epitaxial wafer in which a total density of the large-pit defects caused by micropipes and the large-pit defects caused by substrate carbon inclusions is 0 defect/cm$^2$.

13. The method of manufacturing a SiC epitaxial wafer according to claim 1, wherein a total density of the micropipes in the SiC single crystal substrate and the substrate carbon inclusions is 1 defect/cm$^2$ or less.

14. The method of manufacturing a SiC epitaxial wafer according to claim 1, further comprising: a step of selecting a SiC single crystal substrate in which a total density of the micropipes in the SiC single crystal substrate and the substrate carbon inclusions is 1 defect/cm$^2$ or less.

15. The method of manufacturing a SiC epitaxial wafer according to claim 1, wherein the SiC epitaxial wafer has no basal plane dislocations (BPD) in the SiC epitaxial layer and a BPD density in the SiC single crystal substrate of 400/cm$^2$ or less.

16. A method of manufacturing a SiC epitaxial wafer in which a SiC epitaxial layer is formed on a single crystal substrate, comprising:

a step of forming a SiC epitaxial layer on a SiC single crystal substrate, a step of obtaining microscopic and photoluminescence images of the SiC epitaxial wafer using an inspection apparatus, a step of identifying large-pit defects caused by micropipes in the SiC single crystal substrate and large-pit defects caused by substrate carbon inclusions, both of which are contained in the SiC epitaxial layer, using the microscopic and photoluminescence images, a step of distinguishing the large-pit defects caused by micropipes in the substrate and the large-pit defects caused by substrate carbon inclusions by comparing the microscopic and photoluminescence images of the SiC epitaxial wafer with microscopic and the photoluminescence images of a SiC single crystal substrate in the same ingot as the SiC single crystal substrate, a step of identifying locations of the large-pit defects caused by micropipes in the SiC single crystal substrate and the large-pit defects caused by substrate carbon inclusions in the SiC epitaxial layer based on the distinguishing step, wherein a total density of the large-pit defects caused by micropipes in the SiC single crystal substrate and the large-pit defects caused by substrate carbon inclusions is 1 defect/cm$^2$ or less.

* * * * *